US 6,652,312 B2

(12) United States Patent
Liegl et al.

(10) Patent No.: US 6,652,312 B2
(45) Date of Patent: Nov. 25, 2003

(54) ENCAPSULATED ELECTRICAL DEVICE

(75) Inventors: Erwin Liegl, Eberdingen (DE); Ralf Haug, Leonberg (DE); Herbert Gentner, Schwieberdingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/048,871

(22) PCT Filed: May 26, 2001

(86) PCT No.: PCT/DE01/02030

§ 371 (c)(1),
(2), (4) Date: Jun. 25, 2002

(87) PCT Pub. No.: WO01/93377

PCT Pub. Date: Dec. 6, 2001

(65) Prior Publication Data

US 2002/0173199 A1 Nov. 21, 2002

(30) Foreign Application Priority Data

Jun. 2, 2000 (DE) .......................................... 100 27 363

(51) Int. Cl.[7] .................. H01R 13/52; H02G 15/08; H02G 3/02
(52) U.S. Cl. .......................... 439/519; 439/521; 174/76
(58) Field of Search ................................ 439/519, 521, 439/271, 278; 174/76

(56) References Cited

U.S. PATENT DOCUMENTS 4,909,756 A    3/1990  Jervis .......................... 439/521
5,594,210 A    1/1997  Yabe ............................ 714/76
5,895,280 A  * 4/1999  Buss et al. ................... 439/271
5,900,585 A  * 5/1999  Winfield et al. ........... 174/74 R

FOREIGN PATENT DOCUMENTS

DE    36 40 385    6/1988
EP    0 722 624    5/1999

* cited by examiner

Primary Examiner—Chandrika Prasad
(74) Attorney, Agent, or Firm—Kenyon & Kenyon

(57) ABSTRACT

An electrical device includes two housing parts that may be joined to form one closed housing, the housing parts in the joined state enclosing a housing interior space, as well as an electrical/electronic circuit element arranged in the housing inner space, and a sealing material for protecting the circuit element. The two housing parts may be configured as half-shells and the interior area of the half-shells, in each case, may be subdivided by interior walls into at least two chambers, of which, in each case, a first chamber is filled with the sealing material and has spatial dimensions which are greater than the dimensions of the circuit element, the interior walls of the second half-shell, in the joined state of the two half-shells, overlapping the interior walls of the first half-shell with clearance, the interior walls of the first half-shell penetrating somewhat into the first chamber of the second half-shell, and the circuit element between the two half-shells being enveloped by the sealing material contained in the two first chambers, up to its electrical connections.

12 Claims, 3 Drawing Sheets

ENCAPSULATED ELECTRICAL DEVICE

FIELD OF THE INVENTION

The present invention relates to an electrical device.

BACKGROUND INFORMATION

European Published Patent Application No. 0 722 624 describes an electrical device which has a first and a second housing part, which together form a closed housing. Arranged in the housing is a circuit element that is configured as a printed-circuit board, supporting elements configured in the first housing part penetrating through-openings in the printed-circuit board. The support elements are configured so that the printed-circuit board moves in the direction of the first housing part when the second housing part is mounted, and a sealing material, arranged between the printed-circuit board and the first housing part, is subjected to compression and is squeezed into a position in which it forms a circumferential bulge on the side walls of the housing and as a result seals the contact area of the two housing parts. In the housing part that is sealed in this manner, a hollow space filled with air remains between the printed-circuit board and the second housing part. Retaining elements that are configured on the second housing part prevent the printed-circuit board, once it has arrived in its final position, from being pressed back into the hollow space by the compressive force of the compressed sealing material, as a result of which the sealing bulge would be pulled away from the housing walls. One disadvantage in such a device is that the printed-circuit board must be provided with openings for the supporting elements, and therefore space is lost on the printed-circuit board for the arrangement of electrical and/or electronic components. In addition, electrical connecting leads cannot be fed into the housing interior through the bulge-like seal between the housing parts, and therefore must be fed, in a cumbersome manner, through a separate passage in one of the two housing parts into the housing interior. This passage also must be sealed off, requiring additional expense. Harmful gases in the enclosed hollow space above the printed-circuit board can impair the mode of functioning of the electronic components on the printed-circuit board.

SUMMARY

As a result of the electrical device according to the present invention, the foregoing disadvantages that may arise may be avoided, and reliable protection from harmful environmental influences is made possible for a circuit element arranged in a housing. The device assures a sufficient seal of the circuit element with respect to spray water, humidity, or submersion in water. The device is both simple as well as economical to manufacture and has two half-shells, the interior area of which in each case is subdivided by interior walls into at least two chambers, of which a first chamber is filled with sealing material, e.g., a gel, and has spatial dimensions that are larger than the dimensions of the circuit element. In the joined state of the two half-shells, the interior walls of the second half-shell overlap, with clearance, the inner walls of the first half-shell, as a result of which it is achieved that the sealing material contained in the two half-shells comes into contact around the circuit element in a frame-like, circumferential area, merges together, and thus seals off the circuit element circumferentially. Due to tolerances in the housing dimensions, tolerances in the pouring of the sealing material, and a shrinking process in response to the hardening of the sealing material, the sealing material poured into the first chambers before the assembly of the two half-shells forms a meniscus, so that the surface of the sealing material in the two chambers is curved in a concave manner and contacts the upper edges of the inner walls, although in the center of the chamber it recedes somewhat towards the interior. This may not be avoided in a simple manner and, without taking countermeasures, results in hollow spaces arising above and below the printed-circuit board when the two half-shells are joined together, due to the concave curvature. In order, when the two half-shells are joined together, to prevent a faulty seal of the edge area of the printed-circuit board from arising as a result of an insufficient pressure of the sealing material in the edge area of the printed-circuit board, resulting from the presence of the hollow spaces, it is provided that the interior walls of the first half-shell, when the two half-shells are joined, penetrate somewhat into the first chamber of the second half-shell. As a result, it is achieved that the first chambers of the half-shells, engaging one another, form an overlapping area, a sufficient quantity of sealing material being pressed out of the overlapping area when the half-shells are joined in order that the edge area of the circuit element be enveloped in sealing material circumferentially in a sufficiently reliable manner. In this manner, it may be achieved that the circuit element between the two half-shells is encased up to its electrical leads by the sealing material contained in the two first chambers, i.e., it is arranged so as to be encapsulated in the sealing material.

Example embodiments and refinements of the present invention are described below.

The interior area of each half-shell may be subdivided, by two interior walls, extending parallel to each other, which join to each other two side walls of the half-shells facing each other, into a first chamber arranged centrally and two second chambers laterally adjoining the first chamber. The second chambers provided in each half-shell function, inter alia, as the receiving areas for excess sealing material that is squeezed out of the first chambers when the two half-shells are joined together. As a result of the distance between the interior walls of the first and the second half-shells, a drainage channel is formed for the sealing material that is squeezed out of the first chambers, which is able to escape via the drainage channel into the second chambers.

The half-shells may be joined to each other, e.g., using a detention arrangement. When the two half-shells are joined together, larger quantities of sealing material are compressed and are squeezed out of the overlapping area of the first chambers. Without a joining arrangement, the strong compressive forces resulting from the compression may force the two half-shells apart. The detention arrangement may therefore be able to withstand larger forces. The detention arrangement, arranged on one half-shell, may include detent hooks having barbed-shaped latches, the hooks, in each case, engaging in a guide slot arranged on the other half-shell and which, in each case, gripping from behind, using their latches, a projecting part arranged in the guide slot. The guide slots protect the latches, so that an unintentional unlatching of the latches is not possible. In particular, the width of each guide slot and the geometrical dimensions of the corresponding latches may be adjusted to each other, so that a latch engaging in a barbed-like manner behind the projecting part may no longer be detached from its latched position without being destroyed.

The side walls of the half-shells may have cutouts, which in the joined state of the housing part, form openings between the two half-shells for the feeding through of the electrical connecting leads. When the two half-shells are joined, the connecting leads extending through the openings to the outside are embedded in the sealing material.

A strain relief device may be provided on at least one half-shell for the electrical connecting leads.

DETAILED DESCRIPTION

Figure 1:
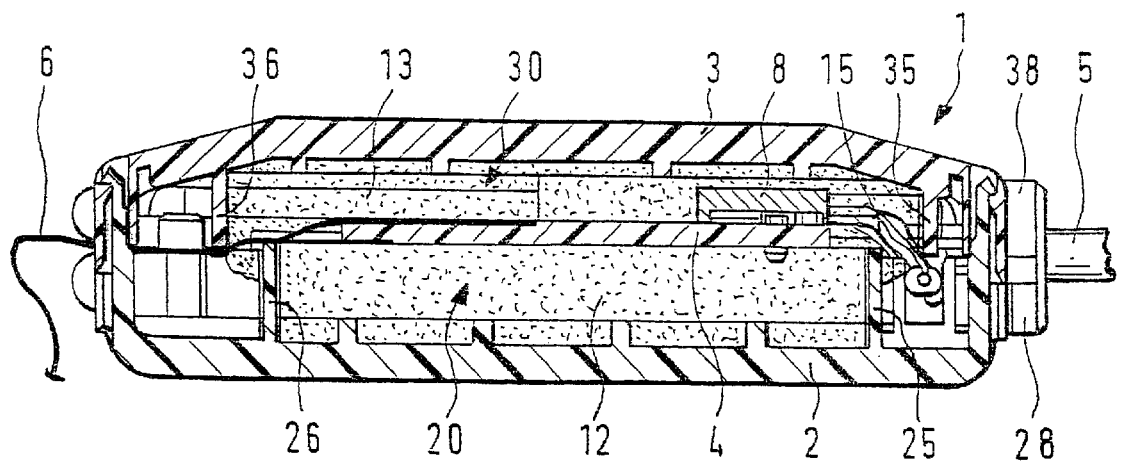
FIG. 1 is a cross-sectional view of an electrical device according to the present invention.

FIG. 1 illustrates an electrical device for a system for occupant classification in a motor vehicle. The device includes a housing 1, in which is arranged an electronic circuit element 4, for example, a printed-circuit board having electrical and/or electronic components 7, 8 arranged thereon. The printed-circuit board is connected via a foil conductor 6 to a seat mat for a vehicle seat, the seat mat having a plurality of local pressure-sensitive sensors. In addition, a wire 5 is provided, which connects the electronic circuitry arranged on the printed-circuit board to an airbag. The device makes it possible to determine the passenger occupancy of a vehicle seat and the type of passenger (child or adult) and, as a function of the data ascertained in this manner, to drive an airbag. The present invention, however, is not limited in principle to the example embodiment illustrated but may also be used in other electrical devices which employ a circuit element that is arranged in the interior of a housing and that may be protected against environmental influences, such as humidity or harmful gases.

Figure 3:
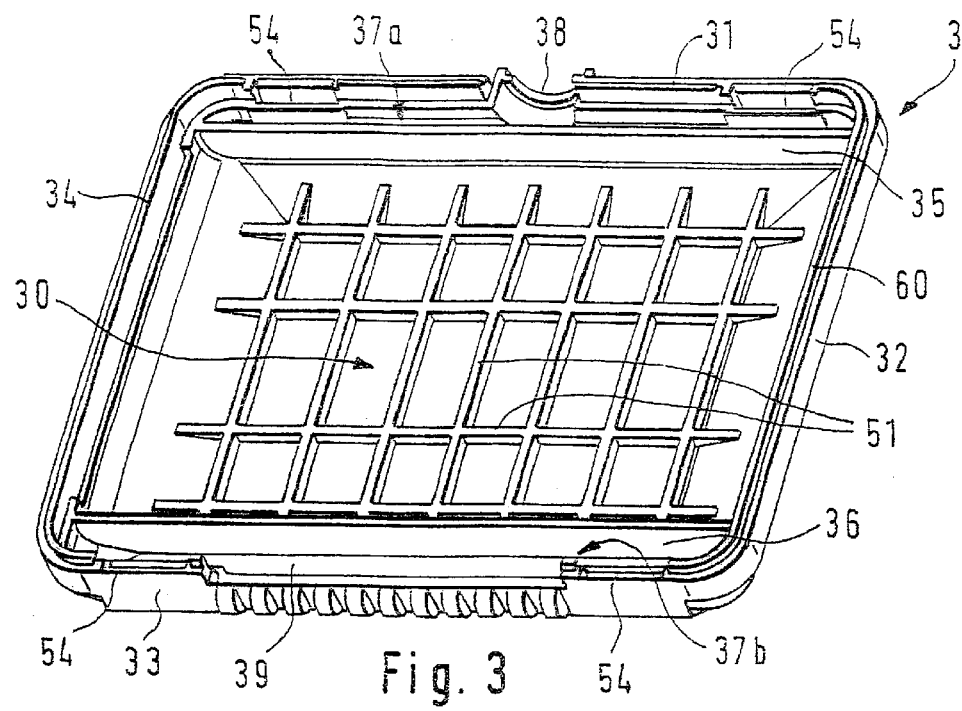
FIG. 3 is a perspective view of the second half-shell.
Figure 4:
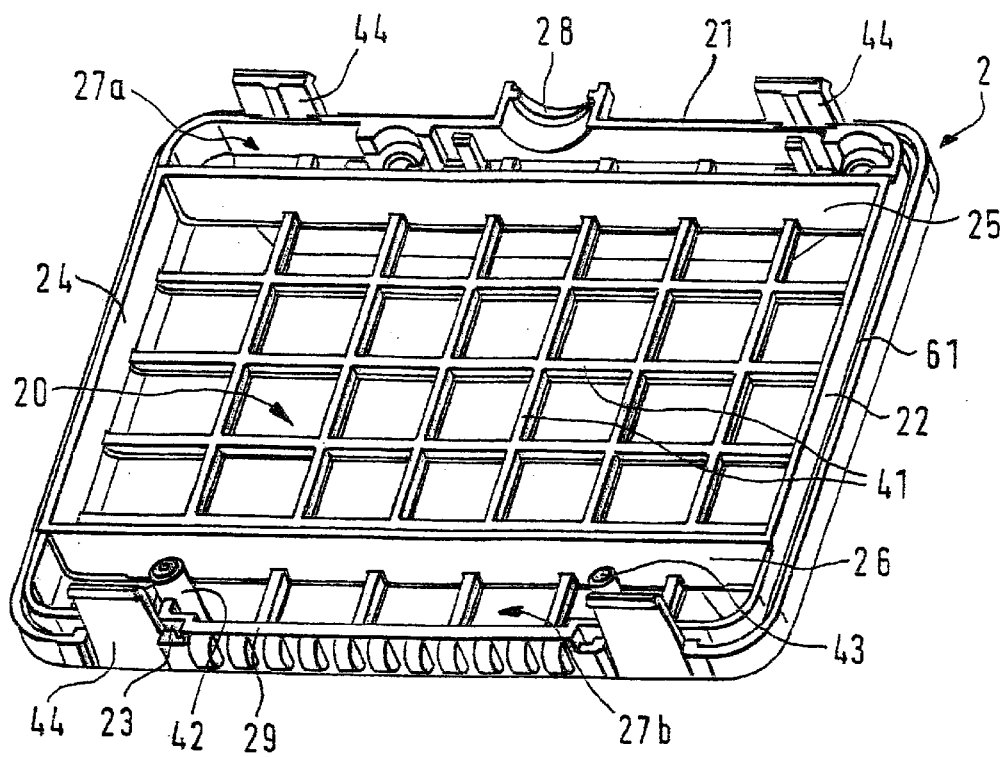
FIG. 4 is a perspective view of the first half-shell.

As illustrated in FIG. 1, housing 1 includes a first half-shell 2 and a second half-shell 3. Both are made of plastic and contain, in the joined state, a housing interior space, in which printed-circuit board 4 is arranged. The half-shells, however, may also be made of a different suitable material, for example, metal. A perspective-view of the interior area of the first half-shell is illustrated in FIG. 4, and a perspective view of the interior area of the second half-shell is illustrated in FIG. 3. As illustrated in FIG. 4, first half-shell 2 has four side walls 21, 22, 23, 24, and a base wall, on the interior side of which a grating made of bars 41 is configured. Side walls 22 and 24, opposite each other, are linked to each other by two parallel interior walls 25, 26, which subdivide the interior area of first half-shell 2 into a first chamber 20 and two second chambers 27a and 27b, laterally adjoining. Essentially rectangular first chamber 20 is bordered by side walls 22 and 24 and interior walls 25 and 26. In addition, side wall 23 has a U-shaped cutout 29, and side wall 21 has a C-shaped cutout 28. On each of the two side walls, 23, two detent hooks 44 are configured, which, parallel to side walls 21, 23, protrude from the upper edge of the side walls. In second chamber 27b, arranged adjoining to cutout 29, two pegs 42 and 43 protrude into the interior area from the base of first half-shell 2, the pegs functioning as a strain relief device for a foil conductor 6. In addition, the exterior edge of side walls 31, 32, 33, 34 has a partially circumferential rib 60.

Figure 2:
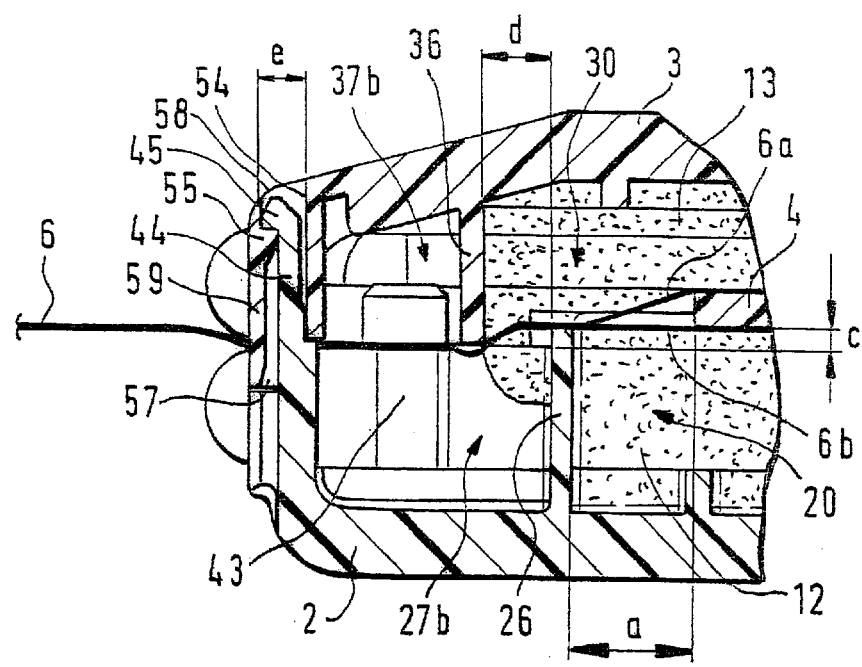
FIG. 2 is a cross-sectional view of a segment of the electrical device illustrated in FIG. 1.

Second half-shell 3 is illustrated in FIG. 3 and is configured similarly to first half-shell 2. It has four side walls 31, 32, 33, 34, and a base wall, on the interior side bars 51 of which are arranged in a grating-like manner. Side walls 32 and 34 are linked to each other by two interior walls 35 and 36, arranged parallel to each other. Side walls 32 and 34 and interior walls 35 and 36 border a centrally arranged first chamber 30, which is separated by interior walls 35 and 36 from two second chambers 37a and 37b, laterally adjoining. Side wall 33 has a U-shaped cutout 39, and side wall 31 has a C-shaped cutout 38. In addition, four through guide slots 54, having a rectangular cross section, are introduced into side walls 31 and 33 for detent hooks 44 of first half-shell 2. Guide slots 54 extend parallel to side walls 31, 33 and have at their ends in each case an opening 57, 58 (FIG. 2). The exterior edge of side walls 21, 22, 23, 24 is provided with a partially circumferential groove 61, into which rib 60 of second half-shell 3 engages when the two half-shells are joined together.

The length and width of first chamber 20 of first half-shell 2 and the length and width of first chamber 30 of second half-shell 3 are in each case dimensioned larger than the length and width of printed-circuit board 4. The distance between interior walls 35 and 36 of second half-shell 3 is dimensioned larger than the distance between interior walls 25 and 26 of first half-shell 2.

Figure 5:
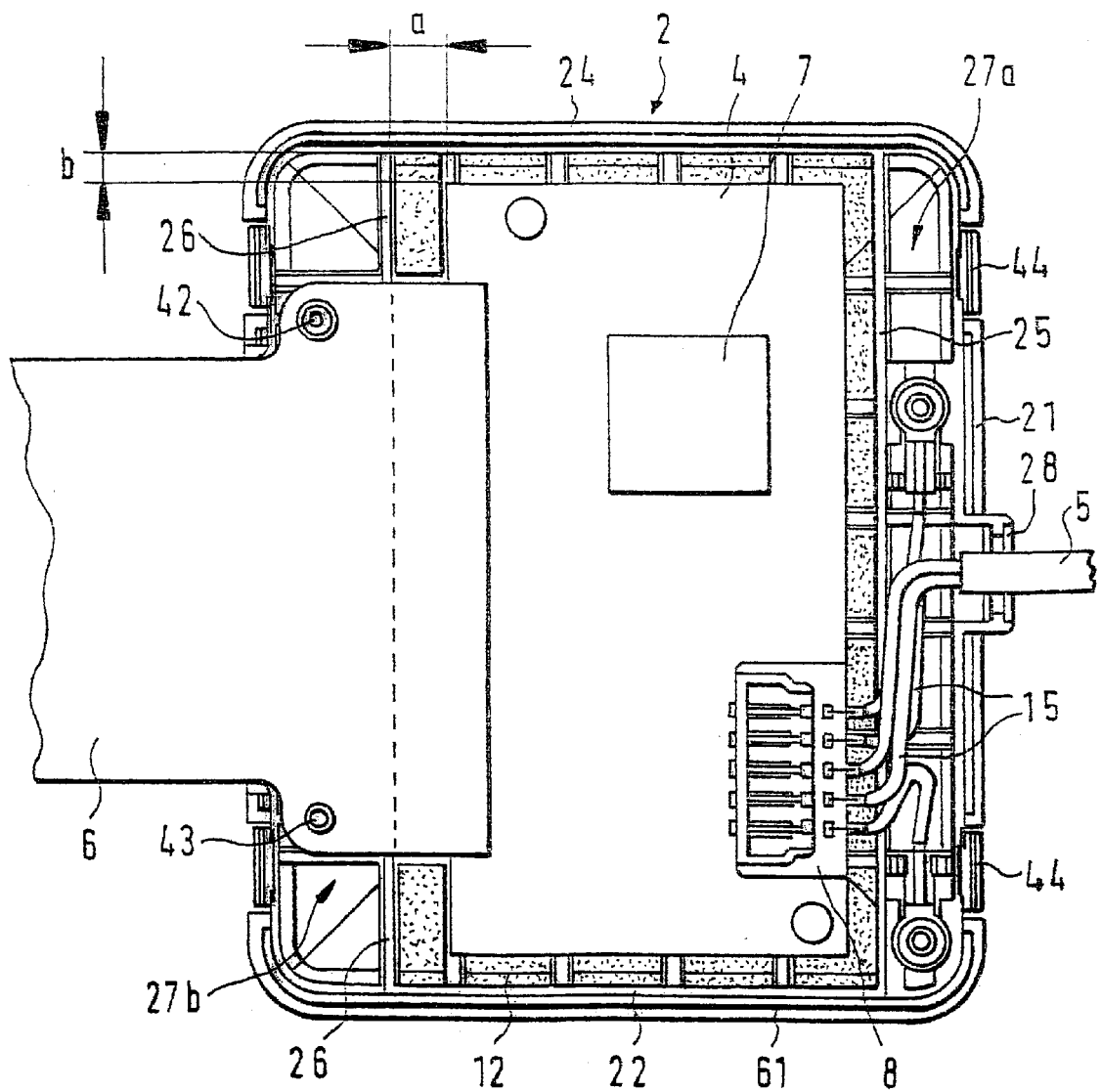
FIG. 5 is a top view of the first half-shell without the second half-shell, having a circuit element placed onto the sealing material, and a foil conductor connected thereto.

When the device is manufactured, first, both first chambers 20 and 30 are filled to the upper edge of the bordering interior walls and side walls with a fluid sealing material. The highly viscous sealing material is made of, for example, a hardened gel. The gel may have a composition as is described in European Published Patent Application No. 0 722 624. The gel, poured into chambers 20, 30, forms a surface that has a concave curvature, the surface receding to the inside in the central area of the first chambers, towards the chamber base. Subsequently, as illustrated in FIG. 5, a printed-circuit board 4, which is provided with electrical and/or electronic components 7, 8, is placed onto gel filling 12 of first chamber 29 of the first half-shell. Printed-circuit board 4 is joined to a foil conductor 6 of the seat mat. Foil conductor 6 has two layers of contact strips 6a and 6b, insulated from each other, which in the end area are separated and are connected to corresponding contact surfaces on the upper side and the lower side of circuit board 4, as illustrated in FIG. 2. As illustrated in FIG. 5, wire conductors 15 of a connecting cable 5 are electrically connected to a connector 8 on printed-circuit board 4 for driving an airbag. Cable conductors 15 may be arranged in second chamber 27a of first half-shell. Foil conductor 6 has circular cutouts, through which pegs 42 and 43 penetrate, as a result of which a strain relief device is formed for foil conductor 6. As illustrated in FIG. 5, the edge of printed-circuit board 4 is separated from side walls 24 and 22 by a distance b of some millimeters and is separated from interior walls 25 and 26 by a distance a, also of some millimeters.

Subsequently, second half-shell 3 is placed onto first half-shell 2. In this context, four detent hooks 44 of first half-shell 2 penetrate through openings 57 into guide slots 54 of second half-shell 3, as illustrated in FIG. 2. Because the distance between interior walls 35 and 36 of second half-shell 3 is dimensioned larger than the distance between interior walls 25 and 26 of first half-shell 2, interior walls 35 and 36 of second half-shell 3, in this context, are beyond interior walls 25 and 26 of first half-shell 2 by a distance d. When both half-shells 2, 3 are brought into closer proximity, gel layers 12 and 13 in both first chambers 20 and 30 come into contact in the edge area of printed-circuit board 4. As a result of further pressure, it is achieved that interior walls 25, 26 of the first half-shell penetrate into first chamber 30 of second half-shell 3 a certain distance c. Interior walls 25, 26 of the first half-shell may penetrate some millimeters into first chamber 30 of second half-shell 3. In this context, printed-circuit board 4 is pressed into gel layer 13 of second half-shell 3. Gel layers 12 and 13 are compressed and gel is squeezed out of the overlapping area. The compressed gel is partially pressed, between set-apart interior walls 25 and 35 and set-apart interior walls 26 and 36, into second chambers 27a and 27b of first half-shell 2. As a result of the partial penetration of first chamber 20 of first half-shell 2, filled with gel 12, into first chamber 30 of second half-shell 3, filled with gel 13, enough gel may be squeezed out to assure with sufficient certainty that the printed-circuit board, having its electrical connecting leads, is completely enveloped by gel, i.e., is encapsulated in gel.

The quantity of displaced gel, in this context, may be adjusted through parameters a, b, and c.

When both half-shells 2, 3 are joined together, C-shaped cutouts 28, 38 form a circular opening for the feeding through of connecting lead 5. Conductors 15 of conducting lead 5 are brought into contact with connector 8 through the gap between interior walls 25 and 35, and are completely enveloped by gel. U-shaped cutouts 29, 39 of both half-shells 2, 3, in the joined state of the two half-shells 2, 3, form a slot-shaped opening, through which foil conductor 6 is conducted into second chambers 27b, 37b. From there, foil conductor 6 extends through the gap between interior walls 26 and 36 to printed-circuit board 4 and is enveloped on all.sides by the gel that is present.

When half-shells 2, 3 are joined together, detent hooks 44, inserted into openings 57, slide into guide slots 54, spring back behind projecting parts 55 in the guide slots, and in a barbed manner, lock in, using their latches 45, behind projecting parts 55, as illustrated in FIG. 2. Width e of guide slot 54, in this context, is dimensioned so that assigned latch 45 may be conducted just barely between projecting part 55, extending into the guide slot, and the inner wall of the guide slot, opposite the projecting part. It may be provided that wall 59 of guide slot 54, provided with projecting part 55, in this context, may be bent in an elastic manner and springs back as soon as latch 45 passes projecting part 55. It may be achieved, in this manner, that detent hooks 44 may not be released from their latched position without being destroyed. The depicted latch connections make possible a reliable and stable latch connection of the two half-shells 2, 3.

The present invention is not limited to the example embodiment illustrated. Modifications of the arrangement of the housing are possible. For example, the interior walls do not necessarily have to extend parallel to each other. Thus it is possible, for example, to set off the first chamber in each half-shell, for example, by circular interior walls from a circular second chamber surrounding the first chamber, or similar modifications. The interior walls of the second half-shell may overlap the interior walls of the first half-shell with clearance, and the interior walls of the first half-shell may penetrate somewhat into the first chamber of the second half-shell. In addition, example embodiments are also possible in which, in place of the foil conductor, a further connecting lead is used, or the control device including only one connecting lead. In place of the gel, another suitable fluid sealing material may be used, which, when the two half-shells are pressed together, is partially squeezed out.

What is claimed is:

1. An electrical device, comprising:
   two housing parts combinable into one closed housing, the housing parts, in a joined state, configured to enclose a housing interior space;
   an electrical circuit element arranged in the housing interior space; and
   a sealing material configured to protect the circuit element;
   wherein the two housing parts are configured as half-shells, and an interior volume of each half-shell subdivided by interior walls into at least two chambers, a first chamber filled with the sealing material and having spatial dimensions larger than dimensions of the circuit element, the interior walls of a second half-shell, in the joined state of the two half-shells, configured to overlap, with a distance, the interior walls of the first half-shell, the interior walls of the first half-shell configured to penetrate a distance into the first chamber of the second half-shell, the circuit element between the two half-shells enveloped by the sealing material contained in the two first chambers up to electrical connections of the circuit element.

2. The electrical device according to claim 1, wherein the interior area of each half-shell is subdivided into a centrally arranged first chamber and two second chambers laterally adjoining the first chamber by two interior walls positioned parallel to each other, the interior walls configured to join two side walls of the half-shells, the side walls opposite each other.

3. The electrical device according to claim 1, wherein each half-shell includes at least one second chamber configured as a receiving area for excess sealing material squeezed out of the first chamber when the two half-shells are joined together, a discharge channel formed by the distance between the interior walls of the first and second half-shells, the discharge channel configured to receive sealing material that is squeezed out of the first chambers.

4. The electrical device according to claim 1, further comprising an arrangement configured to join the half-shells to each other.

5. The electrical device according to claim 4, wherein the arrangement includes detent hooks arranged on a first one of the half-shells, each detent hook configured to engage a guide slot arranged on a second one of the half-shells, a latch of the hooks configured to grasp in barbed fashion a projecting part arranged in the guide slot.

6. The electrical device according to claim 5, wherein a width of each guide slot and geometrical dimensions of the corresponding latch are adjusted to each other so that a latch engaged in a barbed manner behind the projecting part is not releasable from a latched position without being destroyed.

7. The electrical device according to claim 1, wherein the side walls of the half-shells include cutouts that, in the joined state of the housing parts, form openings arranged between the two half-shells, the openings configured to feed through electrical connecting leads.

8. The electrical device according to claim 1, wherein at least one half-shell includes a strain relief device adapted to electrical connecting leads.

9. The electrical device according to claim 1, wherein the electrical connections include electrical connecting leads, the electrical connecting leads including an elastically flexible foil conductor.

10. The electrical device according to claim 1, wherein the sealing material includes a gel.

11. The electrical device according to claim 2, wherein the two housing parts include a partially circumferential rib and a partially circumferential groove to engage with the partially circumferential rib when the two housing parts are joined.

12. The electrical device according to claim 11, wherein the partially circumferential rib is arranged on an exterior edge of side walls of the first half-shell, and the partially circumferential groove is arranged on an exterior edge of side walls of the second half-shell.

* * * * *